US011069647B2

(12) United States Patent
Zhou et al.

(10) Patent No.: US 11,069,647 B2
(45) Date of Patent: Jul. 20, 2021

(54) SEMICONDUCTOR WAFER, BONDING STRUCTURE AND WAFER BONDING METHOD

(71) Applicant: Wuhan Xinxin Semiconductor Manufacturing Co., Ltd., Hubei (CN)

(72) Inventors: Yunpeng Zhou, Hubei (CN); Wanli Guo, Hubei (CN); Xing Hu, Hubei (CN); Yuheng Huang, Hubei (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 0 days.

(21) Appl. No.: 16/598,898

(22) Filed: Oct. 10, 2019

(65) Prior Publication Data
US 2020/0335473 A1   Oct. 22, 2020

(30) Foreign Application Priority Data

Apr. 22, 2019   (CN) .......................... 201910324533.8

(51) Int. Cl.
*H01L 23/00* (2006.01)
*H01L 23/544* (2006.01)
*H01L 25/065* (2006.01)
*H01L 25/00* (2006.01)

(52) U.S. Cl.
CPC ............ *H01L 24/80* (2013.01); *H01L 23/544* (2013.01); *H01L 24/05* (2013.01); *H01L 24/08* (2013.01);
(Continued)

(58) Field of Classification Search
CPC ............ H01L 23/544; H01L 2223/544; H01L 2223/5442; H01L 2223/54426;
(Continued)

(56) References Cited

U.S. PATENT DOCUMENTS 8,115,938 B2   2/2012  Van Haren
10,504,852 B1 * 12/2019  Chen ...................... H01L 24/20
(Continued)

FOREIGN PATENT DOCUMENTS

CN   101526757 A   9/2009
CN   104701301 A   6/2015
(Continued)

OTHER PUBLICATIONS

First Chinese Office Action regarding Application No. 201910324533.8 dated Nov. 1, 2019. English translation provided by Unitalen Attorneys at Law.
(Continued)

*Primary Examiner* — Matthew E Warren
(74) *Attorney, Agent, or Firm* — Harness, Dickey & Pierce, P.L.C.

(57) ABSTRACT

A semiconductor wafer, a bonding structure, and a wafer bonding method are provided. In the semiconductor wafer, a bonding pad which is electrically connected to the interconnection structure is formed in the top cover layer, and a bonding alignment mark formed by a point array is disposed in the top cover layer. In this way, the bonding alignment mark is disposed in the top cover layer, and the top cover layer is not covered by another material layer, thereby facilitating recognition of the alignment pattern by the bonding device and increasing the alignment window in bonding process. Moreover, the bonding alignment mark is formed by a point array, thereby facilitating integration of the process for forming the bonding alignment mark with the bonding hole process and avoiding defects such as the dishing phenomenon in the manufacturing process.

17 Claims, 2 Drawing Sheets

(52) U.S. Cl.
CPC .......... *H01L 25/0657* (2013.01); *H01L 25/50* (2013.01); *H01L 2223/5446* (2013.01); *H01L 2223/54426* (2013.01); *H01L 2224/0217* (2013.01); *H01L 2224/05025* (2013.01); *H01L 2224/08145* (2013.01); *H01L 2224/8013* (2013.01); *H01L 2224/80895* (2013.01); *H01L 2224/80896* (2013.01); *H01L 2225/06524* (2013.01); *H01L 2225/06593* (2013.01)

(58) Field of Classification Search
CPC ... H01L 2224/0217; H01L 2224/08135; H01L 2224/08145; H01L 2224/8012; H01L 2224/8013; H01L 2224/80895; H01L 2224/80896; H01L 2225/06593; H01L 25/0657; H01L 2223/5446; H01L 2224/05025; H01L 2225/06524; H01L 24/05; H01L 24/08; H01L 24/80; H01L 25/50
USPC .................................................. 257/620, 797
See application file for complete search history.

(56) References Cited

U.S. PATENT DOCUMENTS

| | | | |
|---|---|---|---|
| 10,651,157 B1* | 5/2020 | Su | H01L 21/76852 |
| 2009/0225331 A1 | 9/2009 | Van Haren | |
| 2011/0156284 A1 | 6/2011 | Zhang et al. | |
| 2018/0033773 A1* | 2/2018 | Huang | H01L 25/50 |
| 2020/0159133 A1* | 5/2020 | Yan | G03F 9/7049 |
| 2020/0303359 A1* | 9/2020 | Robin | H01L 33/382 |

FOREIGN PATENT DOCUMENTS

| | | |
|---|---|---|
| CN | 104810319 A | 7/2015 |
| CN | 109643700 A | 4/2019 |

OTHER PUBLICATIONS

Second Chinese Office Action regarding Application No. 201910324533.8 dated Mar. 2, 2020. English translation provided by Unitalen Attorneys at Law.

* cited by examiner (A) (B) (C) (D)

(A) (B) (C)

SEMICONDUCTOR WAFER, BONDING STRUCTURE AND WAFER BONDING METHOD

This application claims priority to Chinese Patent Application No. 201910324533.8, entitled "SEMICONDUCTOR WAFER, BONDING STRUCTURE AND WAFER BONDING METHOD" filed with China National Intellectual Property Administration on Apr. 22, 2019, which is incorporated by reference in its entirety.

FIELD

The present disclosure relates to the field of semiconductor devices and manufacture of semiconductor devices, and in particular to a semiconductor wafer, a bonding structure, and a wafer bonding method.

BACKGROUND

With the continuous development of semiconductor technologies, the wafer bonding technology is widely used. The wafer bonding technology involves attaching two wafers with each other, such that the two wafers are bonded to each other in a direction perpendicular to the two wafers.

In the bonding process, the bonding holes on the two wafers are required to be aligned with each other such that the two wafers are connected with each other without deviation. At present, wafers are indirectly aligned with each other, where bonding alignment is achieved by using a lithographic alignment pattern used for forming bonding holes. However, the lithographic alignment pattern is formed on the top metal layer, and the top metal layer is covered by other material layers when bonding is performed, such that the bonding device is instable in recognizing the lithographic alignment pattern. Moreover, the manner of indirect alignment is not conducive to the accurate alignment of bonding.

SUMMARY

In view of the above, an object of the present disclosure is to provide a semiconductor wafer, a bonding structure, and a wafer bonding method, to facilitate recognition of the bonding alignment mark and satisfy process requirements.

In order to achieve the above object, the following technical solutions are provided according to the present disclosure.

According to an embodiment of the present disclosure, a semiconductor wafer is provided, which includes:
a semiconductor substrate;
a device structure on the semiconductor substrate, and an interconnection structure for the device structure;
a top cover layer covering the interconnection structure;
a bonding pad disposed in the top cover layer, wherein the bonding pad is arranged in contact with and is connected to the interconnection structure; and
a bonding alignment mark disposed in the top cover layer, where the bonding alignment mark is formed by a point array disposed in the top cover layer.

In an embodiment, a pattern of the bonding alignment mark includes multiple sub-patterns, and the pattern of the bonding alignment mark is centrally symmetric.

In an embodiment, the multiple sub-patterns include sub-patterns which form a surrounding pattern, and sub-patterns which form a central pattern, and the central pattern is surrounded by the surrounding pattern.

In an embodiment, the surrounding pattern includes a sub-pattern having a polygonal shape.

In an embodiment, the surrounding pattern has a polygonal shape, and the sub-patterns forming surrounding pattern have a strip shape.

In an embodiment, the pattern of the bonding alignment mark includes multiple regions, and sub-patterns in adjacent regions extend in different directions.

In an embodiment, the semiconductor wafer includes chip regions arranged in an array, the device structure is formed in the chip regions, and the bonding alignment mark is formed on scribe lines between adjacent chip regions.

In an embodiment, each point in the point array is a circular cylinder, an elliptical cylinder or a rectangular cylinder.

According to an embodiment of the present disclosure, a bonding structure is provided, which includes multiple wafers bonded to each other in a direction perpendicular to the wafers, at least one of the multiple wafers being the semiconductor wafer according to any one of the above embodiment.

According to an embodiment of the present disclosure, a wafer bonding method is provided, which includes:
providing a to-be-bonded wafer, the to-be-bonded wafer is the semiconductor wafer according to any one of the above embodiment,
performing alignment by using the bonding alignment mark in the to-be-bonded wafer, and
bonding the to-be-bonded wafer to another wafer.

A semiconductor wafer, a bonding structure, and a wafer bonding method are provided according to the embodiments of the present disclosure. The semiconductor wafer is to be bonded to another wafer at a wafer level. In the semiconductor wafer, a bonding pad which is electrically connected to the interconnection structure is formed in the top cover layer, and the bonding alignment mark is formed in the top cover layer. The bonding alignment mark is formed by a point array disposed in the top cover layer. In this way, the bonding alignment mark is disposed in the top cover layer, and the top cover layer is not covered by another material layer, thereby facilitating recognition of the alignment pattern by the bonding device and increasing the alignment window in bonding process. Moreover, the bonding alignment mark is formed by a point array, thereby facilitating integration of the process for forming the bonding alignment mark with the bonding hole process and avoiding defects such as the dishing phenomenon in the manufacturing process.

BRIEF DESCRIPTION OF THE DRAWINGS

In order to more clearly illustrate the technical solutions in the embodiments of the present disclosure or in conventional technology, the drawings used in the embodiments or the description of the conventional technology are briefly described below. Apparently, the drawings in the following description show only some embodiments of the present disclosure, and those skilled in the art can obtain other drawings according to the drawings without any creative work.

DETAILED DESCRIPTION OF THE EMBODIMENTS

To make the above object, features and advantages of the present disclosure more apparent and easier to be understood, particular embodiments of the disclosure are illustrated in detail in conjunction with the drawings hereinafter.

Specific details are described in the following description so that the present disclosure can be understood completely. However, the present disclosure may also be embodied in other ways, a similar extension can be made by those skilled in the art without departing from intension of the present disclosure. Therefore, the present disclosure is not limited to the specific embodiments described below.

In the detail description of the present disclosure with reference to schematic diagrams, the cross-sectional views showing device structures are not drawn to scale, and the schematic diagrams are only examples and should not be construed to limit the scope of protection of the present disclosure. In addition, three-dimensional spatial sizes of a length, a width and a depth should be included in an actual production.

As described in the BACKGROUND, in the bonding process, the bonding holes on the two wafers are required to be aligned with each other such that the two wafers are connected with each other without deviation. At present, wafers are indirectly aligned with each other, where bonding alignment is achieved by using a lithographic alignment pattern used forming bonding holes. However, the lithographic alignment pattern is formed on the top metal layer, and the top metal layer is covered by other material layers when bonding is performed, such that the bonding device is instable in recognizing the lithographic alignment pattern. Moreover, the manner of indirect alignment is not conducive to the accurate alignment of bonding.

Based on the above, a semiconductor wafer is provided according to the present disclosure. In the semiconductor wafer, a bonding pad which is electrically connected to a interconnection structure is formed in a top cover layer, and a bonding alignment mark is formed in the top cover layer. The bonding alignment mark is formed by a point array disposed in the top cover layer. In this way, the bonding alignment mark is disposed in the top cover layer, and the top cover layer is not covered by another material layer, thereby facilitating recognition of the alignment pattern by the bonding device and increasing the alignment window in bonding process. Moreover, the bonding alignment mark is formed by a point array, thereby facilitating integration of the process for forming the bonding alignment mark with the bonding hole process and avoiding defects such as the dishing phenomenon in the manufacturing process.

Figure 1:
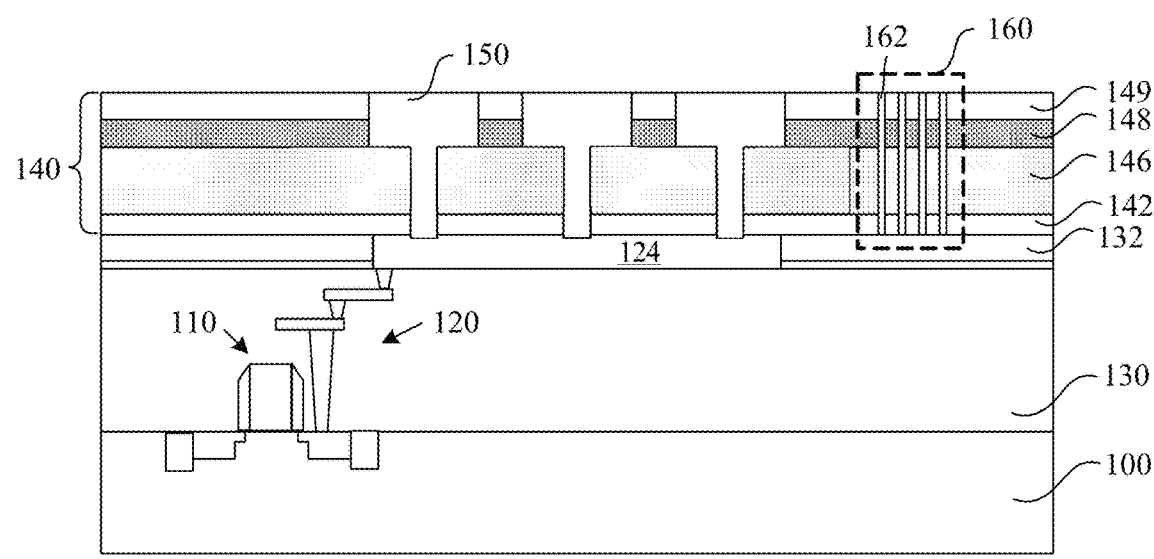
FIG. 1 is a cross sectional view showing a structure of a semiconductor wafer according to an embodiment of the present disclosure.

In order to better understand the technical solutions and technical effects of the present disclosure, the following detailed description is made in conjunction with specific embodiments. As shown in FIG. 1, the semiconductor wafer includes:

a semiconductor substrate 100;

a device structure 110 on the semiconductor substrate 100, and an interconnection structure 120 for the device structure 110;

a top cover layer 140 covering the interconnection structure 120;

a bonding pad 150 disposed in the top cover layer 140, where the bonding pad 150 is arranged in contact with and is connected to the interconnection structure 120; and a bonding alignment mark 160 disposed in the top cover layer 140, where the bonding alignment mark 160 is formed by a point array 162 disposed in the top cover layer 140.

In an embodiment of the present disclosure, the substrate 100 is a semiconductor substrate, and may be, for example, an Si substrate, a Ge substrate, an SiGe substrate, an SOI (Silicon On Insulator), or a GOI (Germanium On Insulator). In other embodiments, the semiconductor substrate 100 may be a substrate including other elemental semiconductors or compound semiconductors, such as GaAs, InP or SiC. Alternatively, the semiconductor substrate 100 may have a stacked structure, such as Si/SiGe, or may have another epitaxial structure, such as SGOI (Silicon On Insulator). In this embodiment, the semiconductor substrate 100 may be a silicon substrate.

A device structure 110 and an interconnection structure 120 for electrical connection with the device structure 110 are formed on the semiconductor substrate 100. The device type of the device structure may include a MOS field effect transistor device, a memory device, and/or other passive devices. The memory device may include a non-volatile memory or a random access memory. The non-volatile memory may include, for example, a floating gate field effect transistor, a ferroelectric memory, or a phase change memory, where the floating gate field effect transistor may include, for example, a NOR-type flash memory or a NAND-type flash memory. The device structure may be a planar device or a three-dimensional device, and the three-dimensional device may be, for example, a FIN-FET (Fin Field Effect Transistor), or a three-dimensional memory. In an example, the device structure may be a MOS field effect transistor device, and the MOS field effect transistor device includes at least a gate dielectric layer, a gate, and a source region and a drain region in the substrate on both sides of the gate. In another example, the device structure may be a floating gate field effect transistor, the floating gate field effect transistor includes at least a gate, a source region and a drain region, where the gate includes a floating gate and a control gate, and the floating gate and the control gate are separated from each other by a dielectric material.

The interconnection structure 120 is formed in dielectric layers 130 and 132. The interconnection structure 120 is configured for electrical leading out of the device structure 110. The interconnection structure 120 may have a multi-layer structure, and includes a contact plug, a wiring layer, and a via hole. The topmost layer of the interconnection structure 120 is a top wiring layer 124, on which the bonding pad 150 is to be formed. The interconnection structure 120 may be made of a metal material, such as tungsten, aluminum, and copper. It should be understood that, in different designs and applications, the number of wiring layers and the number of via holes can be determined according to different requirements.

Similarly, each of the dielectric layers 130 and 132 may have a multi-layer structure, and may include an interlayer dielectric layer covering the device structure 110 and an inner metal dielectric layer on the interlayer dielectric layer for separating the interlayer dielectric layer from the interconnect layer. The dielectric layer may be made of, for example, one or more of undoped silicon oxide ($SiO_2$), doped silicon oxide (such as borosilicate glass, borophosphosilicate glass), silicon nitride ($Si_3N_4$), or other low-k dielectric materials.

The cover layer 140 covers the substrate. A bonding pad 150 which is in contact with and is connected to the interconnection structure 120 is formed in the cover layer 140. The interconnection structure 120 is led out through the bonding pad 150, and the bonding pad 150 is bonded to a corresponding bonding member on another wafer to achieve bonding. The cover layer 140 may be formed by a dielectric material and may have a multi-layer structure. In an embodiment, the cover layer 140 may include an adhesive layer for bonding and a protective layer on the adhesive layer. The cover layer 140 serves as a bonding material layer for bonding to other wafers, while as an isolation layer for isolating the metal material in the bonding pad.

In an embodiment, the cover layer 140 may include a first adhesive layer 146, a second adhesive layer 148, and a protective layer 149, which are sequentially stacked from bottom to top, and a diffusion barrier layer 142 may be formed under the first adhesive layer 146. The materials of the first adhesive layer 146 and the second adhesive layer 148 may be different bonding materials, and the material of the second adhesive layer 148 may be a bonding material with better performance. In this embodiment, the first adhesive layer 146 may be made of a bonding oxide, and the second adhesive layer 148 may be made of NDC (Nitrogen doped Silicon Carbide). The protective layer 149 is configured for protecting the adhesive layer, and may be made of silicon oxide. The diffusion barrier layer 142 functions to avoid sputtering and diffusion of the metal material during the bonding process, and the diffusion barrier layer 142 may be made of silicon nitride.

The bonding pad 150 is formed in the cover layer 140, and the bonding pad 150 is an outermost electrical connection layer of the wafer for alignment bonding to other wafers. The bonding pad 150 is made of a conductive material, which is generally a metal material such as copper. The bonding pad 150 may include a via hole on the top metal layer 124 and a groove on the via hole. In this embodiment, the via hole extends through the first adhesive layer 146 and the diffusion barrier layer 142 under the first adhesive layer 146 to the top metal layer 124, and is in contact with and is connected to the top metal layer 124. The groove is located on the via hole and extends through the second adhesive layer 148 and the protective layer 149.

In the present disclosure, the bonding alignment mark 160 is formed in the top cover layer 140, and the bonding alignment mark 160 is made of a different material from at least the surface layer of the top cover layer 140. The bonding alignment mark 160 may be formed in the process of forming the bonding pad 150. The bonding alignment mark 160 is formed by a point array 162 disposed in the top cover layer 140. The bonding alignment mark 160 is a pattern for bonding alignment, and is formed by a point array 162. The point array 162 is an array of points, where each of the points in the array may be a cylinder, such as a circular cylinder, an elliptical cylinder or a rectangular cylinder. The rectangular cylinder may be a rectangular cylinder or a square cylinder. The point array 162 may extend through the entire top cover layer 140 or through a portion of the top cover layer 140 with a certain thickness. The point array 162 may be made of the same material as the bonding pad 150.

When forming the bonding alignment mark 160, a pattern of the bonding alignment mark 160 is first etched in the top cover layer 140, then a filling material is deposited, and then excess filling material is removed by a planarization process. The pattern of the bonding alignment mark 160 is a point array, that is, a pattern formed by holes which are spaced apart from each other and arranged in an array, so that the defect of the dishing phenomenon due to a pattern having a large area can be avoided in the planarization process, and process of forming the point array is easily integrated with the bonding hole process, thereby improving the process achievability and integration without increasing the manufacturing cost.

Figure 2:
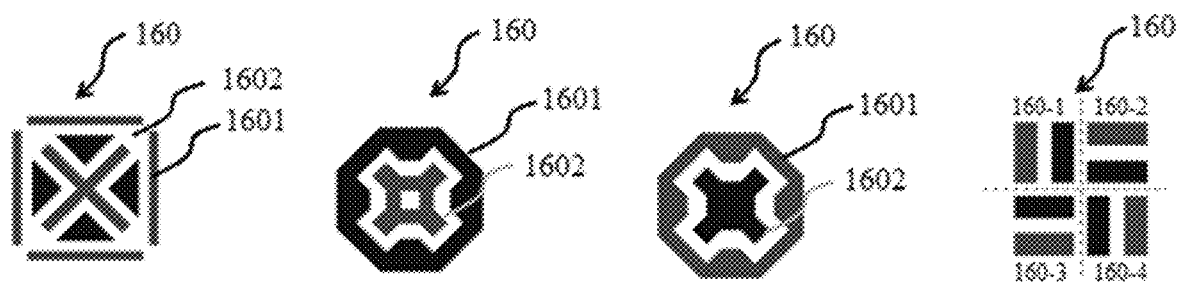
FIG. 2 is a top view showing a structure of a bonding alignment mark in a semiconductor wafer according to an embodiment of the present disclosure.

In an embodiment, as shown in FIG. 2, the pattern of the bonding alignment mark 160 may include multiple sub-patterns, and the pattern of the bonding alignment mark 160 may be centrally symmetric, thereby facilitating the calculation of the alignment algorithm and improving the efficiency and accuracy of the alignment. The sub-patterns are formed by the point array 162 disposed in the top over layer 140. The sub-patterns are spaced from each other by a certain interval, which is much larger than the spacing between the points in the point array.

Specifically, in some embodiments, as shown in (A) of FIG. 2, the multiple sub-patterns include sub-patterns which form a surrounding pattern 1601, and sub-patterns which form a central pattern 1602, and the central pattern 1602 is surrounded by the surrounding pattern 1601. The surrounding pattern 1601 may be a polygonal pattern includes multiple strip sub-patterns, and may be, for example, a quadrangle. In this embodiment, the central pattern 1602 is formed by a sub-pattern of crossed strips extending along diagonals of the quadrangle and four triangle sub-patterns, and the four triangle sub-patterns are respectively disposed in four regions formed by the sub-pattern of crossed strips. The size of the bonding alignment mark 160 may be, for example, 5*14 μm.

In other embodiments, as shown in (B) and (C) of FIG. 2, the surrounding pattern 1601 is a polygonal sub-pattern, such as an octagon. In this embodiment, sides of the polygonal sub-pattern are alternately concavely and convexly disposed, and the sub-patterns of the central pattern 1602 includes a center pattern and an extending pattern extending along the center pattern, and the extending pattern is disposed corresponding to the concave portion of the polygonal sub-pattern. As shown in (B) and (C), the center pattern of the sub-pattern may be a hollow or solid pattern, and the size of the center pattern of the sub-pattern may be, for example, 7*16 μm or 20*20 μm.

In an embodiment, as shown in (D) of FIG. 2, the pattern of the bonding alignment mark 160 may include multiple regions 160-1, 160-2, 160-3, and 160-4. The sub-patterns in adjacent regions extend in different directions, thereby facilitating recognition and processing of the bonding alignment mark 160. In this embodiment, as shown in (D) of FIG. 2, the bonding alignment mark 160 may include regions 160-1, 160-2, 160-3, and 160-4 respectively located in four orientations of upper, lower, left, and right. In adjacent regions, the sub-patterns in one region extend in one direction, and the sub-patterns in the other region extend in another direction, and the two directions may be perpendicular to each other. The size of the bonding alignment mark 160 may be, for example, 10*27 μm.

Figure 3:
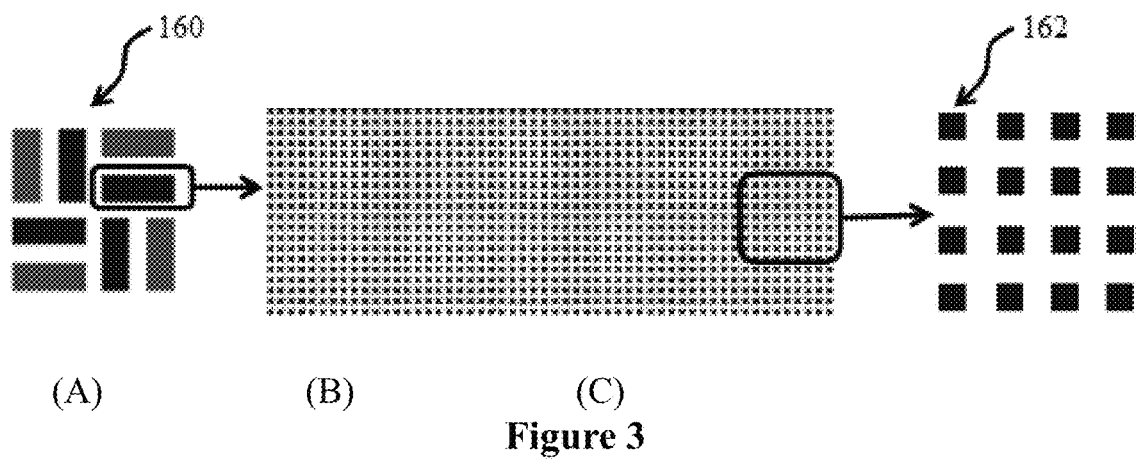
FIG. 3 is a partially enlarged top view showing a structure of a bonding alignment mark in a semiconductor wafer according to an embodiment of the present disclosure.

In order to facilitate understanding of the structure of the bonding alignment mark, a partially enlarged top view of a bonding alignment mark is taken as an example for illustration. Reference is made to FIG. 3, where (A) shows a pattern of the bonding alignment mark 160, (B) is an enlarged view of a portion of the pattern in (A), and (C) is an enlarged view of a portion of the pattern in (B). It can be seen that the pattern is formed by a point array, and the points in the point array may have substantially the same size as the interval between the points. The point array 162 is formed in the top cover layer 140, each point being surrounded by the top cover layer 140.

The bonding alignment mark 160 may be formed on scribe lines of a wafer. The wafer includes chip regions arranged in an array for forming a device structure, and the areas between the chip regions are scribe lines. The scribe lines are used for dividing the wafer, such that the chip regions form separate chips.

The structure of the semiconductor wafer according to the embodiments of the present application is described in detail above, and the semiconductor wafer is to be bonded to other wafers at a wafer level. The bonding alignment mark is disposed in the top cover layer, and the top cover layer is not covered by another material layer, thereby facilitating recognition of the alignment pattern by the bonding device and increasing the alignment window in bonding process. Moreover, the bonding alignment mark is formed by a point array, thereby facilitating integration of the process for forming the bonding alignment mark with the bonding hole process and avoiding defects such as the dishing phenomenon in the manufacturing process.

Figure 4:
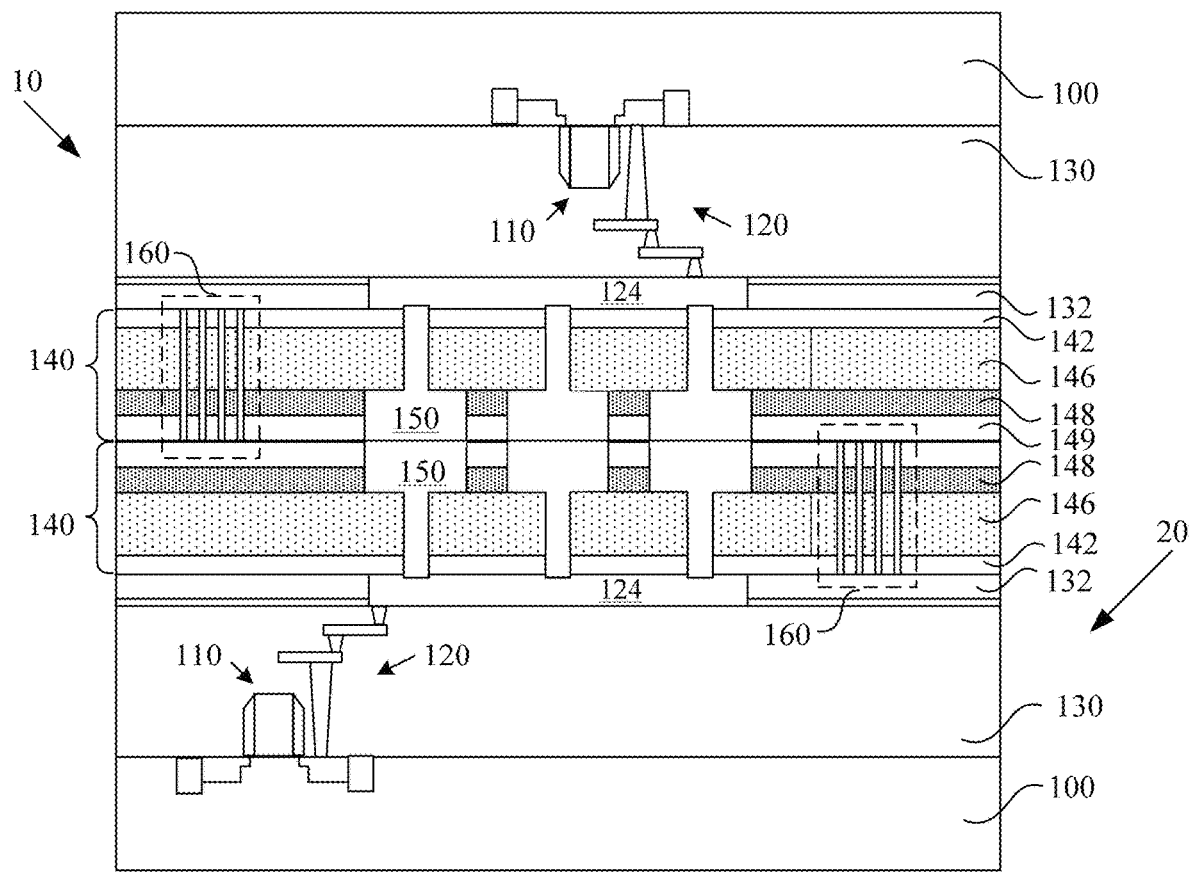
FIG. 4 is a cross sectional view showing a bonding structure according to an embodiment of the present disclosure.

In addition, a bonding structure is provided according to the present disclosure, as shown in FIG. 4, the bonding structure includes wafers 10 and 20. Wafers 10 and 20 are bonded to each other in a direction perpendicular to the wafers, and perpendicular to the substrate. At least one of the wafers 10 and 20 is the semiconductor wafer in the above embodiment.

In addition, a wafer bonding method is further provided according to the present disclosure. The method is used for bonding the above semiconductor wafer. The method includes the following steps S01 to S03.

In step S01, a to-be-bonded wafer is provided, which is the semiconductor wafer in the above embodiment.

The to-be-bonded wafer is a wafer on which all processing for forming the device structures is completed, and the to-be-bonded wafer is the semiconductor wafer in the above embodiment. In the top cover layer of the to-be-bonded wafer, a bonding alignment mark is disposed, and the bonding alignment mark is formed by a point array disposed in the top cover layer. The to-be-bonded wafer is provided to a bonding device for bonding to another wafer.

In step S02, alignment is performed by using the bonding alignment mark in the to-be-bonded wafer.

Since the bonding alignment mark is disposed in the top cover layer of the to-be-bonded wafer, the bonding device can align the to-be-bonded wafer by using the bonding alignment mark, and indirectly achieve the alignment with another wafer. The bonding alignment mark is disposed in the top cover layer, which is not covered by other material layers, thereby facilitating recognition of the alignment pattern by the bonding device and increasing the alignment window in bonding process.

In step S03, the to-be-bonded wafer is bonded to another wafer.

The another wafer may be aligned in the bonding device, and the another wafer may also be the semiconductor wafer in the above embodiment, in the top cover layer of which a bonding alignment mark is disposed, and the pattern of the bonding alignment mark is formed by a point array in the top cover layer. The another wafer may also be aligned by using the bonding alignment mark.

After alignment, the relative position of the to-be-bonded wafer in the bonding device is determined, and the relative position of the to-be-bonded wafer with the another wafer is also determined. Further, a bonding process is performed, achieving accurate alignment of the two wafers and improving yield of the formed bonding structure.

The various embodiments of the present disclosure are described in a progressive manner, and each embodiment focuses on differences from other embodiments, and the same or similar parts between the various embodiments may be referred to each other. In particular, for the memory device disclosed in the embodiments, since the principle is the same as the method disclosed in the embodiments, the description is relatively simple, and the relevant parts can be referred to the method part.

The above are only preferred embodiments of the present disclosure. Although the present disclosure has been disclosed above in the preferred embodiments, it is not intended to limit the disclosure. Those skilled in the art, without departing from the technical solutions of the present disclosure, can make many possible variations and modifications to the technical solutions of the present disclosure or modify them into equivalent embodiments by using the methods and technical contents disclosed above. These variations and modifications and equivalent embodiments also fall into the scope of the present disclosure.

The invention claimed is:

1. A semiconductor wafer, comprising:
   a semiconductor substrate;
   a device structure on the semiconductor substrate, and an interconnection structure for the device structure;
   a top cover layer covering the interconnection structure;
   a bonding pad disposed in the top cover layer, wherein the bonding pad is arranged in contact with and is connected to the interconnection structure; and
   a bonding alignment mark disposed in the top cover layer;
   wherein a pattern of the bonding alignment mark comprises a plurality of sub-patterns, each of the plurality of sub-patterns comprises an array of dots, and a smallest distance among the plurality of sub-patterns is greater than a distance between centers of adjacent dots in the array of one of the plurality of sub-patterns.

2. The semiconductor wafer according to claim 1, wherein the pattern of the bonding alignment mark is centrally symmetric.

3. The semiconductor wafer according to claim 2, wherein the plurality of sub-patterns comprise sub-patterns which form a surrounding pattern, and sub-patterns which form a central pattern, and the central pattern is surrounded by the surrounding pattern.

4. The semiconductor wafer according to claim 3, wherein the surrounding pattern includes a sub-pattern having a polygonal shape.

5. The semiconductor wafer according to claim 3, wherein the surrounding pattern has a polygonal shape, and the sub-patterns forming surrounding pattern have a strip shape.

6. The semiconductor wafer according to claim 2, wherein the pattern of the bonding alignment mark comprises multiple regions, and sub-patterns in adjacent regions extend in different directions.

7. The semiconductor wafer according to claim 1, wherein the semiconductor wafer comprises chip regions arranged in an array, the device structure is located the chip regions, and the bonding alignment mark is located in scribe lines between adjacent chip regions.

8. The semiconductor wafer according to claim 1, wherein each dot in the array corresponds to a circular cylinder, an elliptical cylinder or a rectangular cylinder that is disposed in the top cover layer.

9. A bonding structure, comprising a plurality of wafers bonded to each other in a direction perpendicular to the wafers, at least one of the plurality of wafers being a semiconductor wafer comprising:
- a semiconductor substrate,
- a device structure on the semiconductor substrate, and an interconnection structure for the device structure,
- a top cover layer covering the interconnection structure,
- a bonding pad disposed in the top cover layer, wherein the bonding pad is arranged in contact with and is connected to the interconnection structure, and
- a bonding alignment mark disposed in the top cover layer;
- wherein a pattern of the bonding alignment mark comprises a plurality of sub-patterns, each of the plurality of sub-patterns comprises an array of dots, and a smallest distance among the plurality of sub-patterns is greater than a distance between centers of adjacent dots in the array of one of the plurality of sub-patterns.

10. The bonding structure according to claim 9, wherein the pattern of the bonding alignment mark is centrally symmetric.

11. The bonding structure according to claim 10, wherein the plurality of sub-patterns comprise sub-patterns which form a surrounding pattern, and sub-patterns which form a central pattern, and the central pattern is surrounded by the surrounding pattern.

12. The bonding structure according to claim 11, wherein the surrounding pattern includes a sub-pattern having a polygonal shape.

13. The bonding structure according to claim 11, wherein the surrounding pattern has a polygonal shape, and the sub-patterns forming surrounding pattern have a strip shape.

14. The bonding structure according to claim 10, wherein the pattern of the bonding alignment mark comprises multiple regions, and sub-patterns in adjacent regions extend in different directions.

15. The bonding structure according to claim 9, wherein the semiconductor wafer comprises chip regions arranged in an array, the device structure is located in the chip regions, and the bonding alignment mark is located in scribe lines between adjacent chip regions.

16. The bonding structure according to claim 9, wherein each dot in the array corresponds to a circular cylinder, an elliptical cylinder or a rectangular cylinder.

17. A wafer bonding method, comprising:
- providing a to-be-bonded wafer, wherein the to-be-bonded wafer is a semiconductor wafer comprising:
  - a semiconductor substrate,
  - a device structure on the semiconductor substrate, and an interconnection structure for the device structure,
  - a top cover layer covering the interconnection structure,
  - a bonding pad disposed in the top cover layer, wherein the bonding pad is arranged in contact with and is connected to the interconnection structure, and
  - a bonding alignment mark disposed in the top cover layer, wherein a pattern of the bonding alignment mark comprises a plurality of sub-patterns, each of the plurality of sub-patterns comprises an array of dots, and a smallest distance among the plurality of sub-patterns is greater than a distance between centers of adjacent dots in the array of one of the plurality of sub-patterns;
- performing alignment by using the bonding alignment mark in the to-be-bonded wafer; and
- bonding the to-be-bonded wafer to another wafer.

* * * * *